(12) United States Patent
Henzler et al.

(10) Patent No.: US 11,463,048 B2
(45) Date of Patent: Oct. 4, 2022

(54) DISTRIBUTED FEED-FORWARD ENVELOPE TRACKING SYSTEM

(71) Applicant: Intel Corporation, Santa Clara, CA (US)

(72) Inventors: Stephan Henzler, Munich (DE); Andreas Langer, Unterschleissheim (DE); Bernhard Raaf, Neuried (DE)

(73) Assignee: Intel Corporation, Santa Clara, CA (US)

( * ) Notice: Subject to any disclaimer, the term of this patent is extended or adjusted under 35 U.S.C. 154(b) by 71 days.

(21) Appl. No.: 17/031,944

(22) Filed: Sep. 25, 2020

(65) Prior Publication Data

US 2021/0075372 A1    Mar. 11, 2021

Related U.S. Application Data

(63) Continuation of application No. 16/490,230, filed as application No. PCT/US2017/053669 on Sep. 27, (Continued)

(51) Int. Cl.
| | |
|---|---|
| H03F 1/30 | (2006.01) |
| H03F 1/02 | (2006.01) |
| H02M 3/07 | (2006.01) |
| H03F 3/189 | (2006.01) |
| H03F 3/19 | (2006.01) |

(Continued)

(52) U.S. Cl.
CPC ............ *H03F 1/0216* (2013.01); *H02M 3/07* (2013.01); *H03F 1/0227* (2013.01); *H03F 3/189* (2013.01); *H03F 3/19* (2013.01); *H03F 3/21* (2013.01); *H03F 3/24* (2013.01); *H03F 3/68* (2013.01); *H03M 1/66* (2013.01); *H02M 3/158* (2013.01); *H03F 2200/102* (2013.01); *H03F 2200/321* (2013.01); *H03F 2200/451* (2013.01); *H03F 2200/511* (2013.01)

(58) Field of Classification Search
CPC .................................. H03F 1/30; H03G 3/20
USPC .......................................... 330/297, 129, 136
See application file for complete search history.

(56) References Cited

U.S. PATENT DOCUMENTS

| | | | |
|---|---|---|---|
| 8,183,917 B2 * | 5/2012 | Drogi | H03F 3/245 |
| | | | 330/136 |
| 9,160,287 B2 * | 10/2015 | Briffa | H03F 3/19 |

(Continued)

*Primary Examiner* — Henry Choe
(74) *Attorney, Agent, or Firm* — 2SPL Patent Attorneys PartG mbB; Yong Beom Hwang

(57) ABSTRACT

Systems, methods, and circuitries are provided for generating a power amplifier supply voltage based on a target envelope signal for a radio frequency (RF) transmit signal. An envelope tracking system includes a first selector circuitry and predistortion circuitry. The first selector circuitry is disposed in a selector module and is configured to input a plurality of voltages conducted on a first plurality of power lanes, wherein the first plurality of power lanes is part of a power distribution network; select a voltage from the plurality of voltages based on the target envelope signal; and provide the selected voltage to a supply lane connected to an input of the power amplifier that amplifies the RF transmit signal. The predistortion circuitry is configured to modify the RF transmit signal based on a selected power lane of the first plurality of power lanes that conducts the selected voltage.

16 Claims, 9 Drawing Sheets

Related U.S. Application Data

2017, now Pat. No. 10,790,786, which is a continuation of application No. 15/474,186, filed on Mar. 30, 2017, now Pat. No. 10,090,808.

(60) Provisional application No. 62/512,665, filed on May 30, 2017.

(51) Int. Cl.
*H03F 3/21* (2006.01)
*H03F 3/24* (2006.01)
*H03F 3/68* (2006.01)
*H03M 1/66* (2006.01)
*H02M 3/158* (2006.01)

(56) References Cited

U.S. PATENT DOCUMENTS

| | | | | |
|---|---|---|---|---|
| 9,225,362 B2 * | 12/2015 | Drogi | ............... | H02M 3/1582 |
| 2016/0164551 A1 * | 6/2016 | Khlat | ...................... | H03F 3/19 |
| | | | | 330/297 |

* cited by examiner

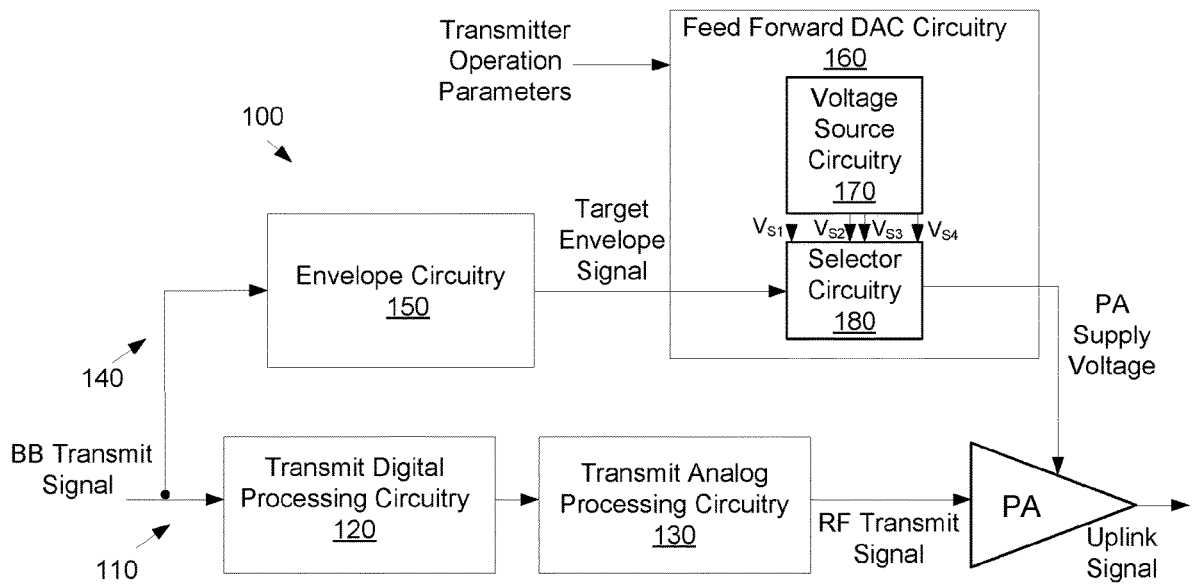
FIG. 1
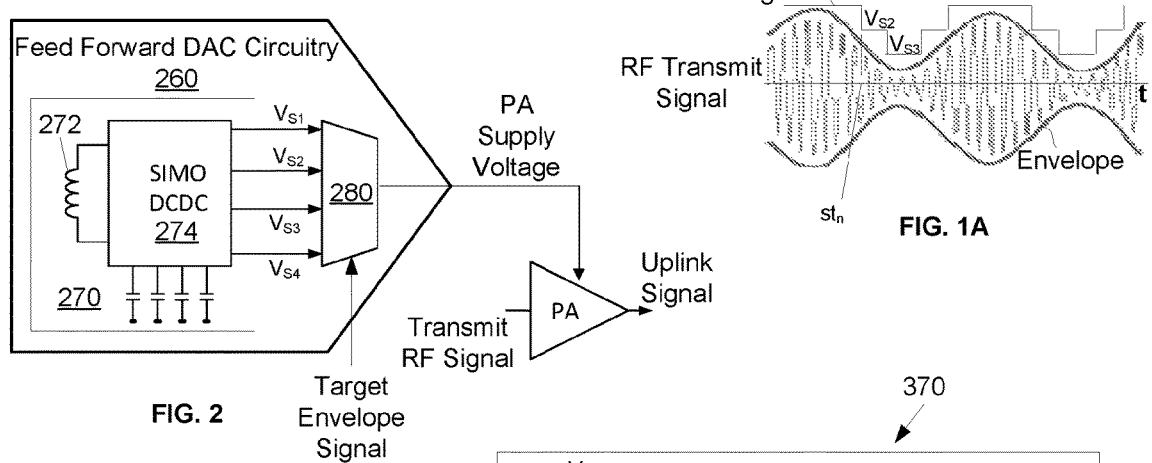
FIG. 1A
FIG. 2
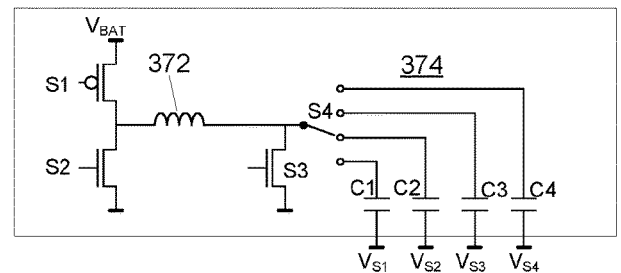
FIG. 3

DISTRIBUTED FEED-FORWARD ENVELOPE TRACKING SYSTEM

CROSS REFERENCE TO RELATED APPLICATIONS

The present application is a continuation of U.S. patent application Ser. No. 16/490,230 filed on Aug. 30, 2019, which is National Phase of the PCT Application No. PCT/US2017/053669 filed on Sep. 27, 2017, which claims priority to U.S. patent application Ser. No. 15/474,186, filed on Mar. 30, 2017 and U.S. Provisional Patent Application Ser. No. 62/512,665, filed on May 30, 2017, the contents of which are incorporated herein by reference in their entirety.

FIELD

The present disclosure relates to the field of wireless transmitters and in particular to methods and apparatus for performing envelope tracking to improve the efficiency of a power amplifier in a transmit chain of a transmitter.

BACKGROUND

Envelope tracking is a technique by which the bias or supply voltage (e.g., $V_{CC}$) and current of a power amplifier (PA) in a transmit chain of a transmitter is controlled based on the RF signal envelope of the transmit signal being amplified by the power amplifier. The idea is to operate the power amplifier close to or slightly in compression and to lower the PA supply voltage when the instantaneous signal amplitude is low, thereby boosting the efficiency of the power amplifier and its supply generation.

BRIEF DESCRIPTION OF THE DRAWINGS

Some examples of circuits, apparatuses and/or methods will be described in the following by way of example only. In this context, reference will be made to the accompanying figures.

FIG. 1 illustrates an exemplary transmitter architecture that includes a feed forward digital to analog convertor (DAC) circuitry that supplies voltage to a power amplifier.

FIG. 1A illustrates an exemplary radio frequency (RF) transmit signal, an envelope of the RF transmit signal, and a PA supply voltage provided to the PA from the feed forward DAC circuitry of FIG. 1.

FIG. 2 illustrates an exemplary feed forward DAC circuitry.

FIG. 3 illustrates an exemplary voltage source circuitry for use in a feed forward DAC circuitry.

FIG. 9A illustrates an exemplary charge pump.

DETAILED DESCRIPTION

Figure 4:
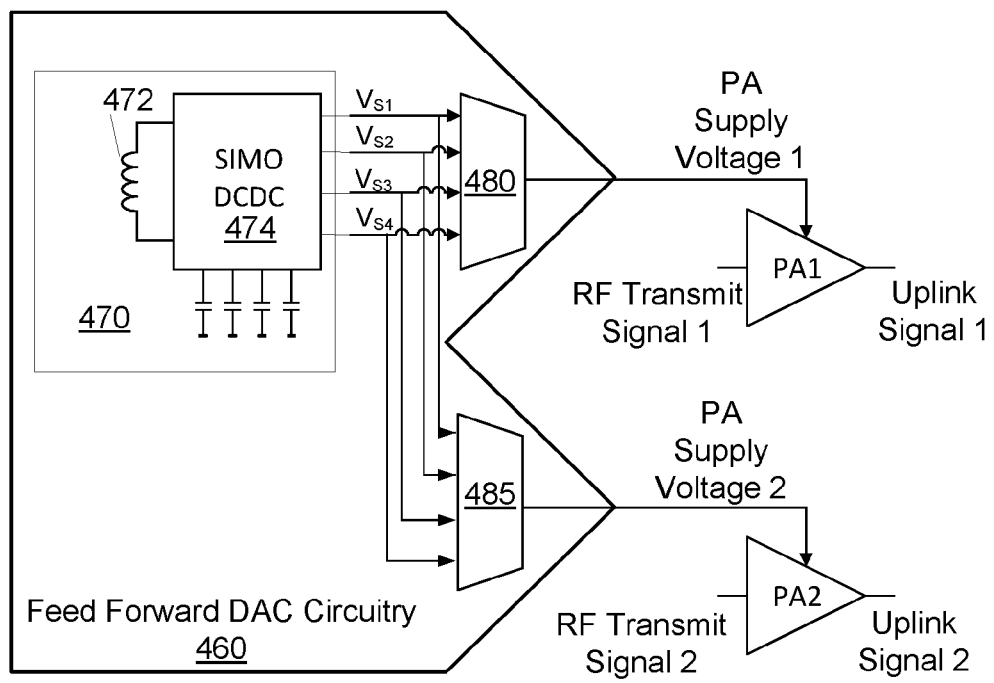
FIG. 4 illustrates an exemplary feed forward DAC circuitry configured to supply voltage to two different power amplifiers.

Some transmitters that employ envelope tracking techniques generate the supply voltage for the power amplifier using an analog control loop. Within the loop, the power amplifier supply voltage is sensed, compared to a target supply voltage that tracks the envelope of the signal being amplified, and the difference is used to steer a continuous actuator such as an amplifier to correct the power amplifier supply voltage. This solution suffers from several problems. For example, the realization of the analog control loop becomes difficult for increasing envelope signal bandwidth while maintaining reasonable system efficiency. Further, the alternating current (AC) signal path used to generate and control the supply voltage to be equal to the target supply voltage and the direct current (DC) signal path used to determine the target supply voltage are normally separated into two supply chains, which yields an unattractively large solution area on the printed circuit board (PCB). The analog control loop for supply voltage control is feasible for 2× or possibly 3× carrier aggregation in the cellular context. For higher levels of carrier aggregation in cellular applications and for WLAN/WiFi applications, the analog control loop solution does not scale.

The systems, devices, and methods described herein perform "feed forward" envelope tracking that generates the power amplifier supply voltage in a feed forward manner. A feed forward digital to analog converter (DAC) circuitry outputs a set of supply voltages, from which one is selected for powering the power amplifier. In this manner, the described feed forward envelope tracking techniques and systems do not rely on an analog control loop and the supply voltage. In addition the described feed forward DAC circuitry is more accurate and less load dependent than an analog control loop, especially at high frequencies.

The present disclosure will now be described with reference to the attached figures, wherein like reference numerals are used to refer to like elements throughout, and wherein the illustrated structures and devices are not necessarily drawn to scale. As utilized herein, terms "module", "component," "system," "circuit," "element," "slice," "circuitry," and the like are intended to refer to a set of one or more electronic components, a computer-related entity, hardware, software (e.g., in execution), and/or firmware. For example, circuitry or a similar term can be a processor, a process running on a processor, a controller, an object, an executable program, a storage device, and/or a computer with a processing device. By way of illustration, an application running on a server and the server can also be circuitry. One or more circuits can reside within the same circuitry, and circuitry can be localized on one computer and/or distributed between two or more computers. A set of elements or a set of other circuits can be described herein, in which the term "set" can be interpreted as "one or more."

As another example, circuitry or similar term can be an apparatus with specific functionality provided by mechanical parts operated by electric or electronic circuitry, in which the electric or electronic circuitry can be operated by a software application or a firmware application executed by one or more processors. The one or more processors can be internal or external to the apparatus and can execute at least a part of the software or firmware application. As yet another example, circuitry can be an apparatus that provides specific functionality through electronic components without mechanical parts; the electronic components can include one or more processors therein to execute software and/or firmware that confer(s), at least in part, the functionality of the electronic components.

It will be understood that when an element is referred to as being "electrically connected" or "electrically coupled" to another element, it can be physically connected or coupled to the other element such that current and/or electromagnetic radiation (e.g., a signal) can flow along a conductive path formed by the elements. Intervening conductive, inductive, or capacitive elements may be present between the element and the other element when the elements are described as being electrically coupled or connected to one another. Further, when electrically coupled or connected to one another, one element may be capable of inducing a voltage or current flow or propagation of an electro-magnetic wave in the other element without physical contact or intervening components. Further, when a voltage, current, or signal is referred to as being "applied" to an element, the voltage, current, or signal may be conducted to the element by way of a physical connection or by way of capacitive, electro-magnetic, or inductive coupling that does not involve a physical connection.

Use of the word exemplary is intended to present concepts in a concrete fashion. The terminology used herein is for the purpose of describing particular examples only and is not intended to be limiting of examples. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

In the following description, a plurality of details is set forth to provide a more thorough explanation of the embodiments of the present disclosure. However, it will be apparent to one skilled in the art that embodiments of the present disclosure may be practiced without these specific details. In other instances, well-known structures and devices are shown in block diagram form rather than in detail in order to avoid obscuring embodiments of the present disclosure. In addition, features of the different embodiments described hereinafter may be combined with each other, unless specifically noted otherwise.

FIG. 1 illustrates a transmitter architecture 100 that includes a transmitter chain 110 and an exemplary envelope tracking system 140. The transmitter chain 110 processes a digital baseband transmit signal to generate a radio frequency (RF) transmit signal. The RF transmit signal is amplified by a PA to generate an uplink signal that is transmitted by an antenna or cable (not shown). The exemplary transmit chain 110 includes transmit digital processing circuitry 120, which operates on a digital baseband transmit signal to convert the signal into amplitude and phase components. The amplitude and phase components are converted into the analog RF transmit signal by transmit analog processing circuitry 130.

The envelope tracking system 140 includes envelope circuitry 150 to generate a target envelope signal, which is used to control a feed forward DAC circuitry 160 to supply a selected supply voltage to the PA. The envelope circuitry 150 samples the baseband transmit signal to project an envelope of the RF transmit signal that will be amplified by the PA to generate the uplink signal. FIG. 1A illustrates an exemplary RF transmit signal 190 and an envelope that bounds the RF transmit signal. The envelope circuitry 150 determines the envelope of the RF transmit signal and generates the target envelope signal to control the feed forward DAC circuitry 160 to provide a PA supply voltage that closely matches the envelope.

The target envelope signal includes voltage domain information that may be a control word or voltage that communicates the desired supply voltage or a selection setting from the plurality of voltage levels to the feed forward DAC circuitry 160. In addition, the target envelope signal may include time domain information that communicates a time during which the desired supply voltage should be provided to the PA. For example, the target envelope signal may specify voltage domain information $V_{S2}$ and time domain information $st_n$ to cause the feed forward DAC circuitry 160 to change the PA supply voltage from $V_{S1}$ to $V_{S2}$ at the switching time $st_n$ as shown in FIG. 1A. The time domain information may also include a duration of time until a next voltage level and switching time will be communicated. In order to reduce noise, the envelope circuitry 150 may determine a switching time that will coincide with a relative low RF transmit signal (e.g., when the RF transmit signal is crossing the frequency axis as shown in FIG. 1A). In one example, "relative low" means that the RF transmit signal is lower or equal to a predetermined threshold. In an alternate implementation the envelope circuitry 150 may choose a switching time when the instantaneous envelope signal is low, i.e., when the instantaneous signal power is low. In this case the next selected voltage is an upper bound of all instantaneous envelop signal voltages which occur until another low phase is reached. At the next low phase another voltage is selected and so on. Thus the switching time may be selected based on either a zero crossing of the RF signal or a close to zero condition of the envelope signal.

The feed forward DAC circuitry 160 includes voltage source circuitry 170 and selector circuitry 180. The principle of the feed forward DAC circuitry 160 is to remove the analog control loop of prior envelope tracking systems and instead generate the PA supply voltage in a feed-forward manner from the feed forward DAC circuitry 160. The voltage source circuitry 170 is an analog circuit that is configured to generate a plurality of supply voltages having differing levels. The selector circuitry 180 is a switching circuit that connects one of these supply voltages to the output of the feed forward DAC circuitry 160. The output of the feed forward DAC circuitry 160 is connected to a supply input (not shown) of the PA.

It can be seen in FIG. 1A that the PA supply voltage provided by the feed forward DAC circuitry 160 varies in a stepwise fashion to approximate the envelope. While analog envelope tracking PA power supply solutions may also be able to closely follow the envelope, recall that analog solutions have limited applicability in high frequency applications and present the other drawbacks discussed above. The feed forward envelope tracking described herein provides effective envelope tracking in a manner that scales for higher frequencies and presents a small package size.

The voltage source circuitry 170 is capable of producing any number of voltage levels. To leverage this feature of the voltage source circuitry 170, the feed forward DAC circuitry 160 inputs transmitter operation parameters that include, for example, a transmit power level and mode of operation. The feed forward DAC circuitry 160 may use this information to control which voltage levels are produced by the voltage source circuitry 170. For example, if the transmit power level is relatively small, the set of voltages may span smaller range so that the PA supply voltage can more closely follow the envelope or the number of voltages may be reduced to a smaller set. In contrast, if the transmit power level is large, the set of voltages may span a larger range to cover the variation in the envelope.

FIG. 2 illustrates an exemplary feed forward DAC circuitry 260. Note that in the figures, components having an analogous component in another figure are assigned a reference character that has the same number in the tens and ones digit as the component in the other figure. In order to achieve high efficiency (>90%) a voltage source circuitry 270 generates the set of voltages with an inductor 272 and a single-inductor-multiple-output (SIMO) DCDC converter 274. One exemplary implementation of the voltage source circuitry is illustrated in FIG. 3. The SIMO DCDC converter 274 outputs, in a time multiplexed fashion, a plurality of PA supply voltages $V_{S1}$, $V_{S2}$, $V_{S3}$, and $V_{S4}$.

A selector circuitry 280 is embodied as a multiplexer that is controlled by the target envelope signal to select one of the supply voltages generated by the SIMO DCDC converter 274 to be output by the feed forward DAC circuitry 260. The selector circuitry 280 may be any suitable switch that is capable of connecting one of the SIMO DCDC converter 274 outputs to the PA. While in the illustrated feed forward DAC circuitry the target envelope signal is a digital signal, the target envelope signal may be an analog signal in which case the selector circuitry 280 is capable of being controlled by an analog signal.

When the envelope circuitry switches the target envelope signal voltage from a first voltage level to a second voltage level, in one example the selector circuitry switches directly from the first to the second voltage level. In another example, the selector circuitry may follow a sequence of switching events such as switching back and forth between the first voltage level and the second voltage level several times or switching temporarily to a third voltage level. This may interpolate voltage levels or shape the step response by pre-distorting the voltage wave traveling from the selector circuitry to the input terminal of the PA It can be seen in FIG. 2 that the there is no control loop in the generation of the PA supply voltage. The output PA supply voltage is delivered from pure voltage sources instead of a regulated stage. Thus the PA supply voltage may be more accurate and less load dependent especially at high frequencies and during fast switching. Fast switching multiplexers or other switches are available to be used for the selector circuitry 280. This is advantageous because the higher signal bandwidths of modern devices translate into a need for faster switching between the different voltage levels. The fast switching provided by the selector circuitry 280 thus fits well to modern, digital dominated technologies. The illustrated feed forward DAC circuitry separates the analog task of voltage level generation from the control of voltage selection, which is digital.

FIG. 3 illustrates an exemplary implementation of a voltage source circuitry 170. A SIMO DCDC converter 374 generates several voltage levels with a single coil 372 in a time-multiplexed manner. The SIMO DCDC converter 374 generates the voltages using the inductor 372, a set of capacitors C1-C4, and switches S1, S2, S3, and S4. Switches S1 and S2 are connected to battery voltage and ground, respectively. The SIMO DCDC converter 374 includes control circuitry (not shown) that controls S1 and S2 to either connect the inductor 372 to the battery voltage or ground to maintain a predetermined amount of current stored in the inductor 372. S3 and S4 are controlled by the control circuitry to selectively connect one of the capacitors C1-C4 to either the current source inductor 372 or ground to maintain the amount of voltage stored in the capacitor at its designated supply voltage level. It can be seen that by controlling the switches S1-S4, any number of supply voltages may be generated by the voltage source 370. Recall that the feed forward DAC 160 selects the supply voltages to be generated by the voltage source 370 based at least on operating parameters of the transmitter, such as transmit power. While four supply voltages are illustrated, the number of supply voltages generated by the feed forward DAC may be more or less than four. The controller which controls the switches S1, S2 and S3 may consider the near future switch selection of S4, i.e. the intended voltage selection in near future in order to ramp the coil current to a most appropriate current level. This pre-emptive control of the SIMO switches is possible because the Envelope Circuitry 150 and the Transmit Digital Processing Circuitry know the transmitted signal in advance.

As illustrated in FIGS. 2 and 3, the feed forward DAC architecture may be very small. The largest component, which does not scale well, is the coil 272. Thus it is advantageous to have only one coil in the system. Some other power amplifier supply voltage systems have two coils and these coils cannot be shared among different channels. While the feed forward DAC includes several capacitors C1-C4 in order to stabilize the voltage levels, capacitors scale much better and are already available in much smaller package size than inductors.

FIG. 4 illustrates a feed forward DAC 460 that is configured to generate supply voltages for two different power amplifiers. Once a set of voltages are generated by voltage source circuitry 470, the voltages can be accessed by multiple independent selector circuitries 480 and 485 to feed two (or more) power amplifiers. This makes the feed forward DAC even more attractive because the incremental increase in area utilized for powering an additional power amplifier is only the selector circuitry 485 (e.g., switches) which can have a very small package size. Thus even more voltage levels than active parallel channels can be realized. This is attractive because the capacitive load of the power amplifiers can be distributed to several parallel channels which improves efficiency at high bandwidth.

When the RF DAC and the power amplifier are merged into a single device, the feed forward DAC can be used as well. Then the feed forward DAC is part of this combined DAC and may contribute the MSBs of the output power supply voltage in either an additive or multiplicative way.

While the methods are illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the disclosure herein. Also, one or more of the acts depicted herein may be carried out in one or more separate acts and/or phases.

Figure 5:
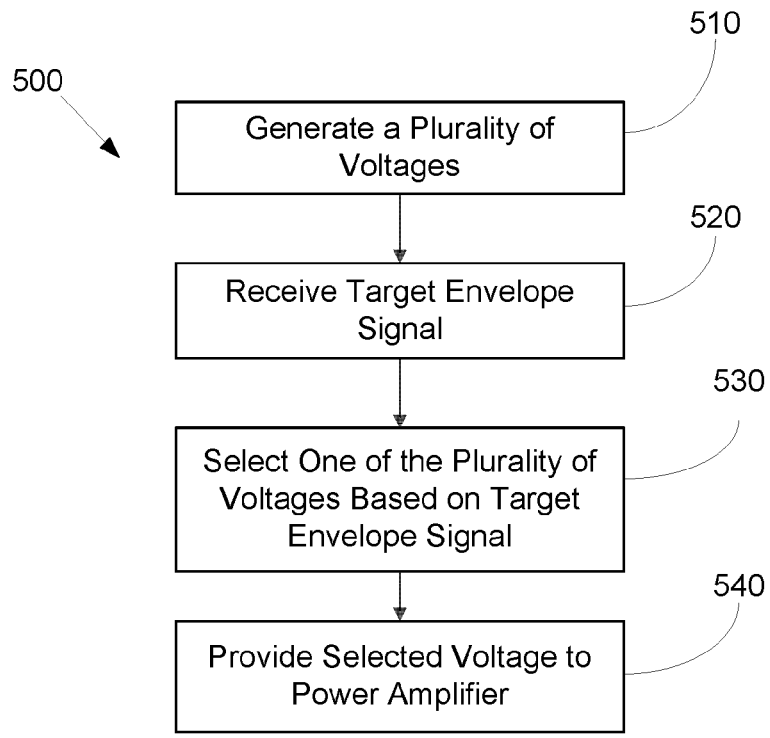
FIG. 5 illustrates an exemplary method for providing supply voltage to a power amplifier.

FIG. 5 depicts a flowchart outlining one embodiment of a method 500 for providing a supply voltage to a power amplifier. The method 500 may be performed by the feed forward DAC circuitry of FIGS. 1 and/or 2. The method includes, at 510, generating a plurality of voltages. At 520, a target envelope signal based on or based on a selected power amplifier supply voltage is received. The method includes, at 530, selecting one of the plurality of voltages based at least on the target envelope signal. At 540 the selected voltage is provided or connected to a supply voltage input of a power amplifier that amplifies a radio frequency (RF) transmit signal.

It can be seen from the foregoing description that the disclosed systems, devices, and methods provide effective envelope tracking over a wide range of frequencies using a feed forward approach to generating power amplifier supply voltages.

Figure 6:
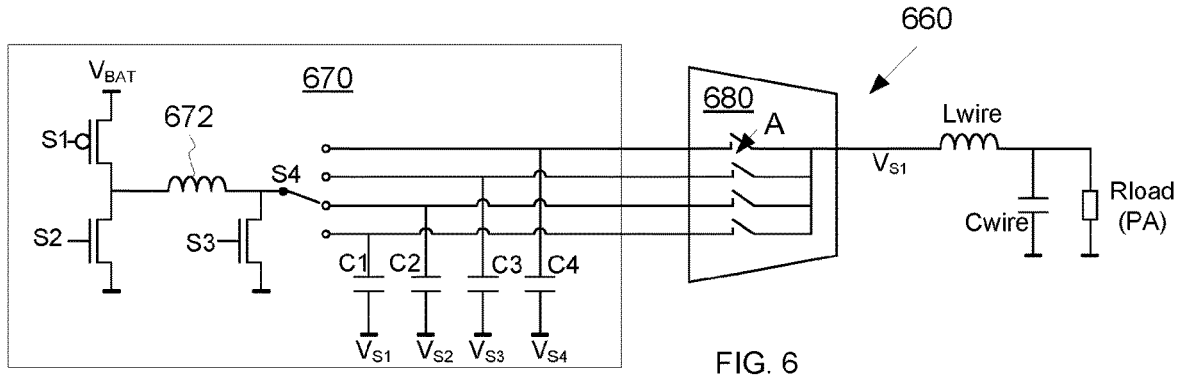
FIG. 6 illustrates an exemplary feed forward DAC circuitry that includes low on-resistance switches in the selector circuitry.

FIG. 6 illustrates an exemplary feed forward DAC 660 that includes voltage source circuitry 670 and selector circuitry 680 as described with reference to FIGS. 1-5. The voltage source circuitry 670 generates a plurality of supply voltages and the selector circuitry 680 includes switches that connect a selected one of the supply voltages to the output of the feed forward DAC 660. The load for the feed forward DAC 660 can be any electrical load (e.g. a power amplifier, a current sink, a capacitance or any combination of these elements). The load is connected to the feed forward DAC 660 by a wire that contributes a wire inductance Lwire and a wire capacitance Cwire. Effectively this arrangement yields the equivalent circuit depicted in FIG. 6 (and FIG. 7), i.e. an LC low pass circuit with output resistance.

Because the feed forward DAC 660 provides high power (high current) to the PA (shown as Rload), any switches in the selector circuitry 680 should have a low on-resistance. Low on-resistance switches yield low power consumption and so high efficiency but also cause poor settling when switching from one voltage to another. If the switch resistance of the selector circuitry 680 which connects the load to a selected supply voltage has a low on-resistance a high-Q resonator arises which will ring as soon as the voltage is switched from one level to another. This is because the load circuit (e.g., power amplifier) which can be described as an LC network, resonates when a step signal is applied via a low resistance path.

Figure 8:
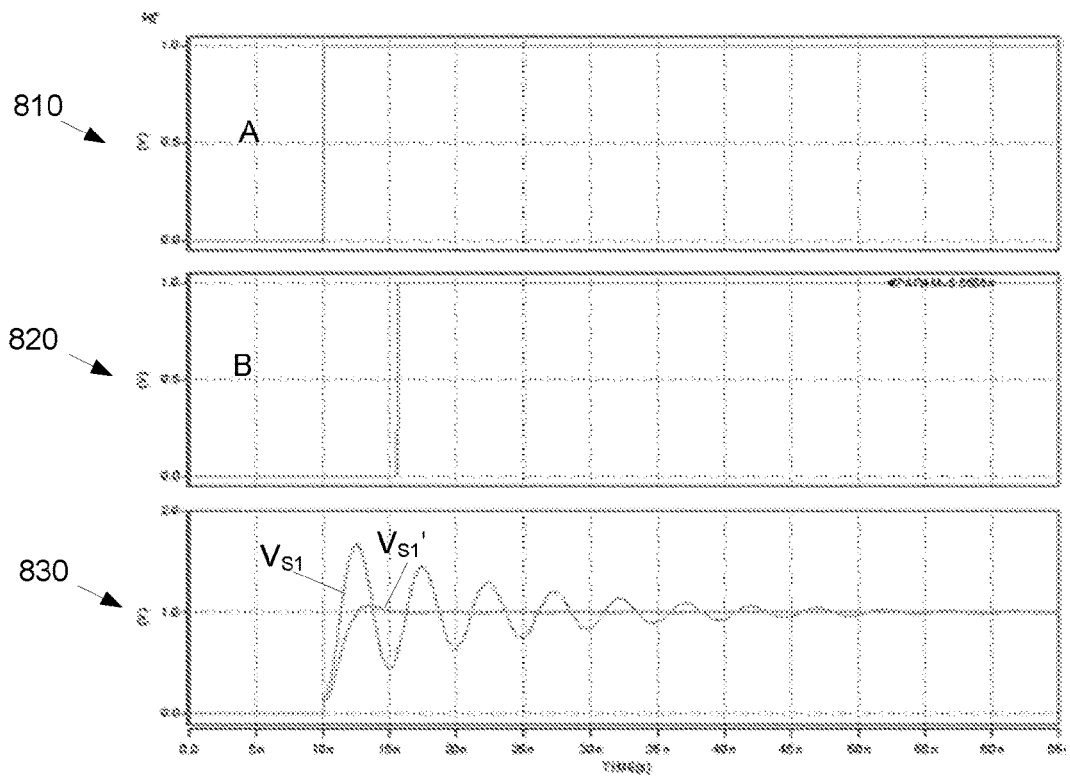
FIG. 8 illustrates voltage traces of supply voltage when the supply voltage is switched.

FIG. 8 illustrates voltage traces captured at the moment that the PA supply voltage output by the feed forward DAC circuitry 660 is switched to $V_{S1}$. In particular, trace 810 illustrates a control signal A that controls a first switch in the selector circuitry 680 to connect the voltage $V_{S1}$ to the power amplifier. It can be seen in trace 830 that $V_{S1}$ exhibits ringing and poor settling. The ringing frequency and the damping depends on the load itself as well as on the wiring parasitics. Thus the settling behavior is not well defined. A reasonably known settling behavior, however, is an important consideration for DAC based envelope tracking as the settling behavior needs to be known for the RF signal pre-distortion.

Figure 7:
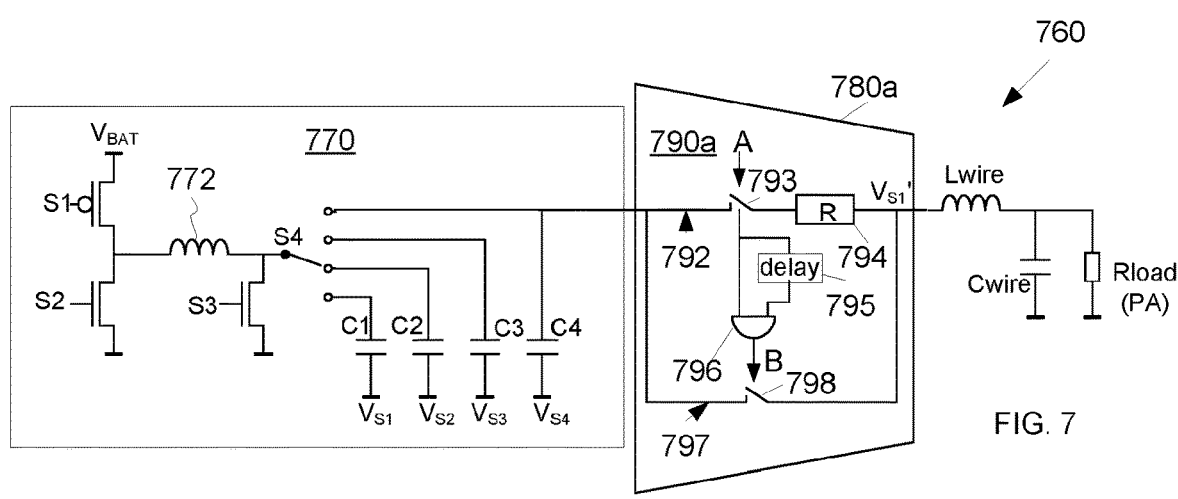
FIG. 7 illustrates an exemplary feed forward DAC circuitry that includes a dual impedance circuitry in the selector circuitry.

In order to achieve acceptable RF performance the resonant settling should be suppressed. Suppression of resonant settling (or ringing) can be done either by a high ohmic driver (which degrades the system efficiency) or by a dissipative output filter (which increases the PCB area and bill of material as well as degrading the system efficiency). FIG. 7 illustrates an exemplary feed forward DAC 760 in which selector circuitry 780 includes dual impedance circuitry 790 that does not exhibit either of these drawbacks. For simplicity sake, only a first portion of the selector circuitry 780a associated with the first supply voltage as well as a corresponding portion of the dual impedance circuitry 790a associated with the first portion of the selector circuitry 780a is illustrated. Additional portions of the selector circuitry 780 and the dual impedance circuitry 790 associated with the other three (or more or less) supply voltages are not illustrated.

Recall that from an efficiency perspective the on-resistance of the selector circuitry switches should be small. From a settling and RF quality perspective the switch on-resistance should terminate the line between the feed forward DAC 760 and the PA such that the step response is aperiodically damped. The dual impedance circuitry 790a first closes a first switch 793 that connects the supply voltage to a high impedance path 792 including a relatively large resistance 794. This first stage of operation of the dual impedance circuitry 790a may be performed in response to receiving control signal A (which may be generated based on the time domain information in the target envelope signal).

Once the voltage has aperiodically settled to its new value the dual impedance circuitry 790a closes a second switch 798 that connects the supply voltage to a low impedance path 797 that includes a small resistance and thus provides a low ohmic connection for the high current that is supplied to the power amplifier. This second phase of operation of the dual impedance circuitry 790a is triggered by control signal B.

To generate control signal B, the dual impedance circuitry 790a includes a delay element or circuitry 795 that delays control signal A. An AND gate circuitry 796 performs a logical AND operation on control signal A and the output of the delay element 795 to generate the control signal B. Thus, the control signal B will go "high" after a predetermined delay period (which is controlled by the delay element 795). Control signal B is illustrated in trace 820 of FIG. 8.

For optimum power efficiency the delay introduced by the delay element 795 shall be chosen to be as small as possible. If the delay is too small, however, the ringing is not fully suppressed. Thus, adaptive delay selection may be employed so the delay can be calibrated when the actual load and wire conditions are known. To calibrate the delay, a peak detector can be connected to the output node of the feed forward DAC 760. Based on the measurement results of this peak detector the delay can be increased until no peaking occurs or the peaking is below an acceptable level. The amount of delay that is suitable for each possible supply voltage may be stored for use when changes in transmitter operation will cause different supply voltages to be used.

The dual impedance circuitry 790a causes each switching event performed by the selector circuitry 780a to include two steps: first a "small" switch 793 is used with source side termination resistance 794 and then after the predetermined delay period a "large" and low ohmic switch 798 is connected in parallel with the source side termination resistance. The same principle can be applied when the interconnect is not lumped but e.g. a micro-strip line. In this case the resistor 794 in series to the first switch is the characteristic impedance of the wire or a function of this characteristic impedance.

FIG. 8 trace 830 shows the supply voltage $V_{S1}'$ that is output by the feed forward DAC 760. It can be seen that when switch control signal A goes high the first switch 793 closes. In series with this switch 793 a damping resistor 794 is placed which avoids ringing during the step response. After a delay the second switch 798 is closed. The second switch does not have a series resistance element and thus provides a low-ohmic connection between the supply voltage output by the feed forward DAC and the load. The effect can be seen in the in trace 830. If the delay is properly selected a step response without ringing is realized: When the control signal A goes low, both switches 793 and 798 are opened immediately.

It can be seen from the foregoing description that the disclosed systems, devices, and methods can achieve aperiodic settling of the supply voltage to a power amplifier together with low switch resistance. Conventional switches can optimize only one of these aspects. Thus they are not well suited for high speed power applications.

Figure 9:
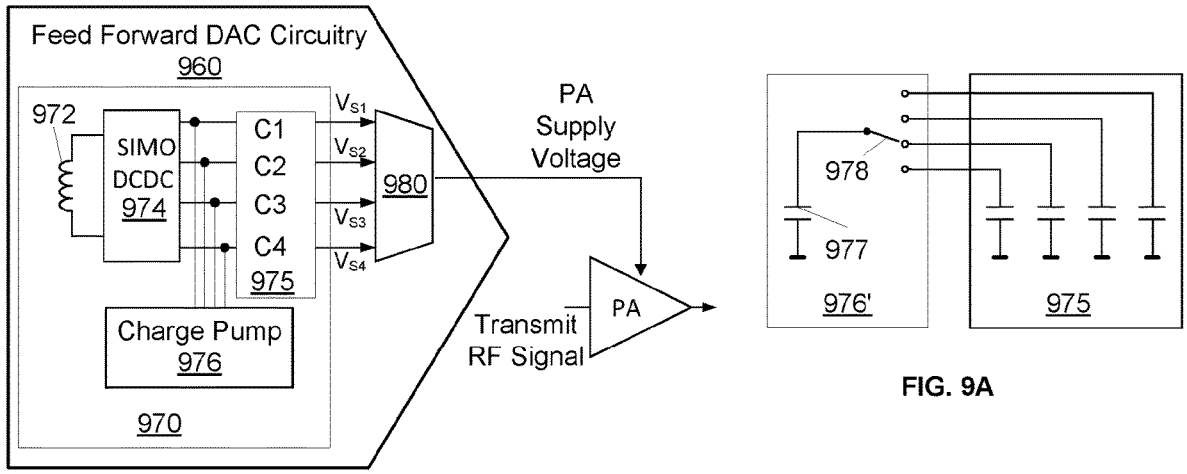
FIG. 9 illustrates an exemplary feed forward DAC that includes a charge pump.

FIG. 9 illustrates an exemplary feed forward DAC circuitry 960 that includes a voltage source circuitry 970 with a SIMO DCDC converter 974 that utilizes a single coil 972 to generate a set of supply voltages across a bank of capacitors 975 (C1-C4) as described above with reference to FIGS. 1-5. A typical SIMO DCDC converter can regulate voltages with a (small) finite bandwidth, e.g. 10 MHz. However, the power amplifier load on the feed forward DAC circuitry 960 is quickly varying with the RF transmit signal envelope bandwidth. Thus the supply voltages $V_{S1}$-$V_{S4}$ generated by the SIMO DCDC converter 974 across the capacitor bank 975 may be perturbed by the load current. One way to generate stable supply voltages which would not be much perturbed by the load current variation is to use very large capacitors in the capacitor bank 975. This, however, would mean using large components which lead to unattractively large PCB area. The capacitors in the bank 975 are intentionally chosen with a relatively small capacitance to present a smaller footprint.

To compensate for the use of small capacitors, the voltage source circuitry 970 includes a charge pump 976 arranged in parallel with the SIMO DCDC converter 974 to make fine adjustments to the voltages across the capacitors 975 to compensate for voltage errors due to perturbations. The use of the charge pump 976 in combination with the SIMO DCDC converter 974 means that very stable voltage levels can be achieved even with small capacitors. Voltage errors resulting from the fact that small capacitors are used are compensated by the charge pump 976 quickly and with high power efficiency The charge pump 976 can be characterized as an adiabatic charge pump that is capable of altering the charge (and so the voltage) of the capacitors 975. The charge pump 976 operates quasi adiabatically, meaning that the charge pump transfers charge to and from the capacitors 975 with low losses, i.e. high efficiency. The major portion of the charge provisioning on the capacitors 975 is done by the relatively slow SIMO DCDC converter 974 and the adiabatic charge pump 976 is responsible for smaller but very fast correction work. The charge pump 976 includes several features that improve its operating efficiency, as will now be described.

If a capacitor C is charged to a voltage V it contains the energy $1/2 \times C \times V^2$ and another $1/2 \times C \times V^2$ is dissipated during the charging process. In other words half of the energy is always lost. For charging and discharging with low losses it is thus important to have a small voltage delta. The capacitors 975 are charged to different nominal voltages and the actual voltages may occasionally deviate from these nominal voltages by a perturbation.

Referring to FIG. 9A, a charge pump 976' is illustrated that includes a pump capacitor 977 (a plurality of capacitors may be used in some examples) that is connected to the bank 975 and, by way of a switch 978, selectively transfers charge from one capacitor in the bank 975 to another capacitor in the bank in order to correct for the perturbations. The losses incurred by such a transfer of power are proportional to the square of the voltage delta across the pump capacitor 977. Because in the charge pump 976' the pump capacitor 977 is connected between ground and the bank capacitors 975, depending on the supply voltages on the capacitors, unacceptably large energy dissipation for an envelope tracking application may result. For example, if the nominal supply voltages across the capacitors are about 1.1, 2.2, 3.3 and 4.4V, when the pump capacitor 977 switches between two adjacent bank capacitors 975 in order to transfer charge from one bank capacitor to the other the voltage delta which causes the losses is always about 1.1V.

Figure 9B:
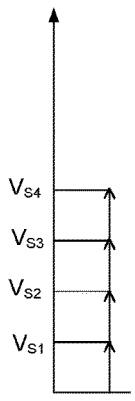
FIG. 9B illustrates, schematically, a selection of supply voltages having an equal spacing.
Figure 9C:
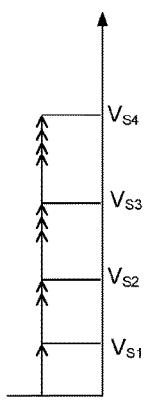
FIG. 9C illustrates, schematically, a selection of supply voltages having an unequal spacing.
Figure 9D:
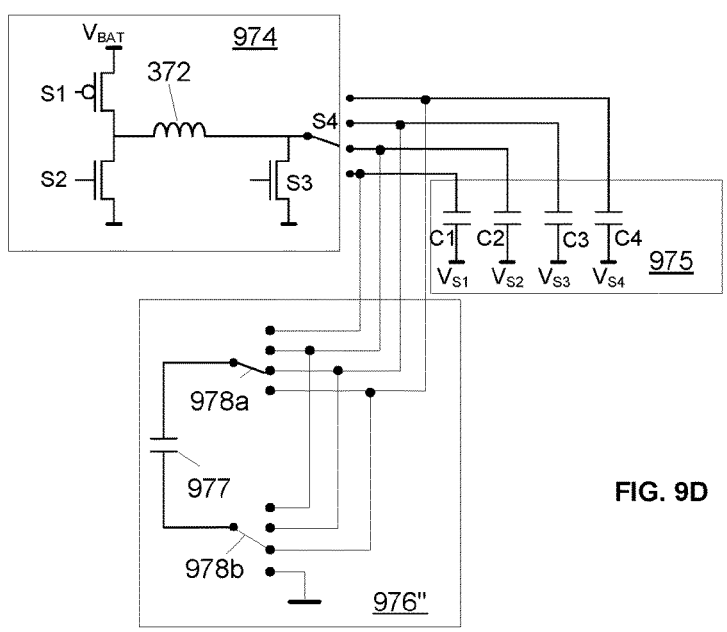
FIG. 9D illustrates an exemplary charge pump.

FIG. 9D illustrates an exemplary charge pump 976" in which the pump capacitor 977 is selectively connected, by way of switches 978a, 978b, in between two of the bank capacitors instead of between a bank capacitor and ground as in FIG. 9A. This arrangement should result in a lower voltage delta across the pump capacitor. As shown schematically in FIG. 9B, if the different supply voltages $V_{S1}$ to $V_{S4}$ are equally spaced in terms of voltage, the voltage delta between capacitors, which leads to the losses, would be small. This would result in relatively small losses. However, the downside to having equally spaced supply voltages is that the amount of charge that can be transferred is also very small, meaning that the pump effect is very small unless a huge pump capacitor or a very high switching frequency is used.

To facilitate an efficient charge pump, the supply voltages $V_{S1}$-$V_{S2}$ are selected such that the voltage levels are not equally spaced but rather the voltage spacing changes slightly from level to level. With this arrangement, the voltage deltas are so small that no significant power dissipation happens when they are alternately connected in between two voltage steps. On the other hand the nominal voltage delta is not zero (as for equally spaced voltages) and so a significant charge transfer is possible even with a reasonably small pump capacitor 977 and switching frequency. FIG. 9C illustrates the concept of using unequal spacing between the supply voltages. For example, if the supply voltage levels $V_{S1}$ to $V_{S4}$ are 1.0V, 2.1V, 3.3V and 4.6V, respectively, the difference between two adjacent voltage deltas (e.g., delta across the pump capacitor when it is connected between C1 and C2 as compared to the delta across the pump capacitor when it is connected between C2 and C3) is always 0.1V. This is the voltage which defines the losses, which will be relatively low. This principle is independent on the actual connection of the capacitors, as long as the voltage delta across the pump capacitor 977 is kept small but not zero.

As can be seen from the foregoing description, an adiabatic charge pump that selectively connects a pump capacitor between two bank capacitors to regulate the charge on the bank capacitors can provide an efficient way to maintain the supply voltages generated by the feed forward DAC circuitry, especially when the supply voltages are not equally spaced.

Distributed Feed Forward DAC

FIGS. 10-13 illustrate various embodiments and aspects of a distributed feed forward DAC in which the generation of the discrete supply voltage levels and the selection of the voltage for the power amplifier are spatially split. In other words, the selector circuitry for each power amplifier is disposed near the power amplifier, rather than being disposed near the voltage source circuitry as illustrated and described in FIGS. 1-9. In the figures various "modules" have been identified. For the purposes of this description, a "module" is defined as incorporating a single piece of semiconductor that is encapsulated and shielded from other modules. For example, when two modules are described, it is to be understood that modules include two different pieces of semiconductor that are individually encapsulated and shielded. In many cases different modules are implemented on separate substrates, however, they may share a substrate.

Referring now to FIGS. 10, 10A, 10B, and 12, a voltage module is illustrated as being separate from a selector module. The selector module(s) may be proximate a corresponding power amplifier. For example the selector modules may be in a front-end module on a printed circuit board that carries a power amplifier (PA). One example selector circuitry has a footprint of less than 5 mm². This distributed approach may reduce the footprint of the feed forward DAC component that includes the voltage generation coil.

Figure 10:
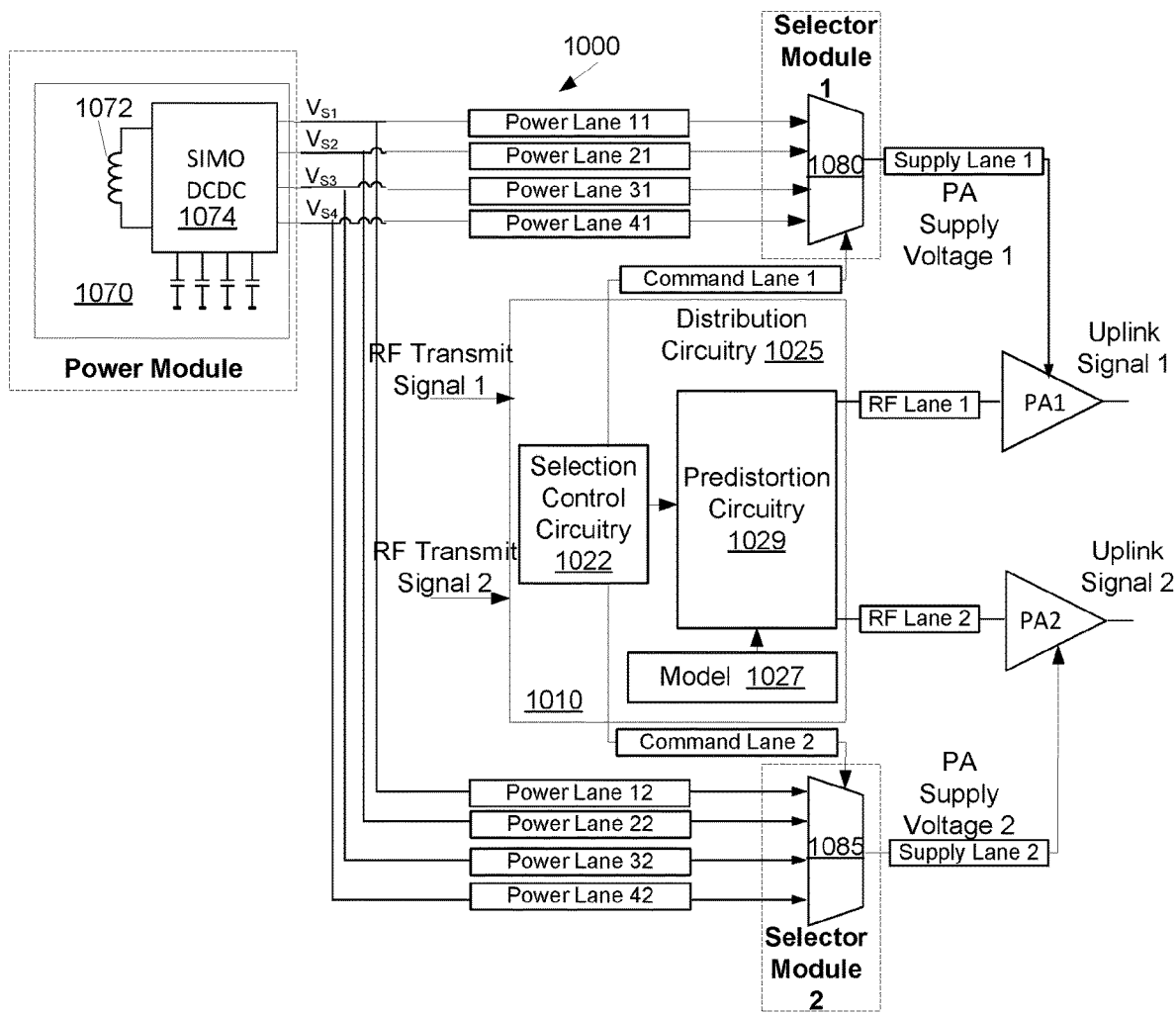
FIG. 10 illustrates an exemplary transmitter architecture that includes distributed feed forward digital to analog convertor (DAC) circuitry that supplies voltage to a power amplifier.

FIG. 10 illustrates a simplified example architecture 1000 (e.g., embodied on a printed circuit board) that includes distribution circuitry 1025 implemented in an RF transceiver component 1010, two power amplifiers PA1 and PA2, and a distributed feed forward DAC system that includes voltage source circuitry 1070, a power distribution network with power lanes and supply lanes, and selector circuitries 1080 and 1085. In other embodiments more than two power amplifiers are present. The power lanes and/or supply lanes may be made up of coaxial cable, flex-cable, a printed circuit board transmission line, or any other wire connection.

The voltage source circuitry 1070 includes a coil 1072 and a DCDC converter 1074 is used to generate supply voltages for both power amplifiers. The voltage source is located or disposed in a power module on the printed circuit board. A first selector circuitry 1080 is located or disposed in a first selector module that is proximate the first power amplifier PA1 and a second selector 1085 is located or disposed in a second selector module that is proximate the second power amplifier PA2. A set of power lanes or wires (e.g., power lanes 11, 21, 31, 41) run between the voltage source circuitry 1070 and the selector circuitry 1080. There is one power lane for each supply voltage generated by the voltage source circuitry. A single supply lane runs between the selector circuitry 1080 and PA1. Likewise a power lane (e.g., power lanes 12, 22, 32, 42) runs between the voltage source circuitry 1070 and the selector circuitry 1085 for each supply voltage generated by the voltage source circuitry. A single supply lane runs between the selector circuitry 1085 and PA2. For the purposes of this description, when the selector modules are described as being located "proximate" or "near" the power amplifier, it means that the power lanes that are longer than the supply lanes. While dedicated power lanes are shown for each power amplifier, in some examples, portions of the power lanes may be shared between power amplifiers.

The distribution circuitry 1025 includes selection control circuitry 1022 that controls, by way of command lanes 1 and 2, the selector circuitry 1080 and 1085 to select a voltage for the power amplifiers PA1, PA2, respectively, (e.g., due to envelope tracking) from among the supply voltages on the power lanes. The selection control circuitry 1022 selects the voltage based on a target envelope signal for the power amplifier being supplied. The distribution of the centrally generated supply voltages over the relatively long (e.g., several centimeter) power lanes means that the PA supply voltage may suffer from switching transients and dynamic voltage drops along the power lanes and also the supply lane. Predistortion circuitry 1029 predistorts the RF transmit signals to compensate for these transients and voltage drops.

The predistortion circuitry 1029 accesses a numeric model 1027 of the power lanes to estimate the voltage transients and voltage deviations. This is to be contrasted with prior systems that provide "PA supply filtering" in which deviations due to the wiring between the switch and the PA (e.g., the supply lanes of FIG. 10) may be compensated, but not deviations due to the wiring between the voltage generation circuitry and the switch (e.g., the power lanes of FIG. 10). In one example the numeric model also estimates voltage transients and voltage deviations in the supply lane in addition to the selected power lane. In some embodiments the predistortion circuitry 1029 is also used to compensate for other impairments that degrade the linearity characteristic of the PA (e.g., PA load-pulling effects or deviations from a wanted amplitude modulation/amplitude modulate (AM/AM) and/or amplitude modulation/phase modulation (AM/PM) response of the PA.

Figure 10A:
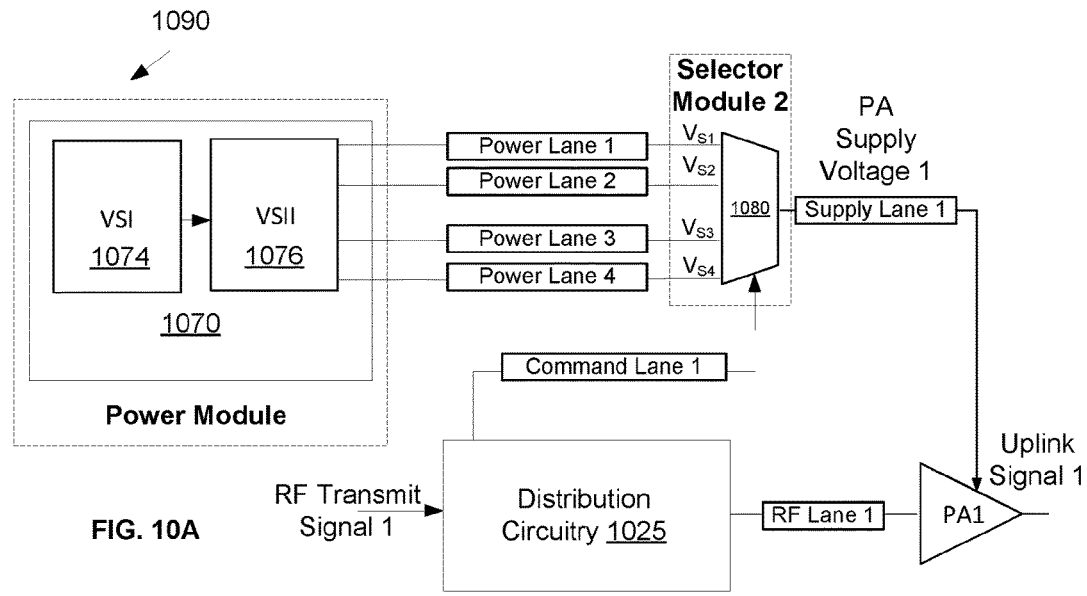
FIGS. 10A-10B illustrate an exemplary transmitter architecture that includes distributed feed forward digital to analog convertor (DAC) circuitry with distributed voltage source circuitry.
Figure 10B:
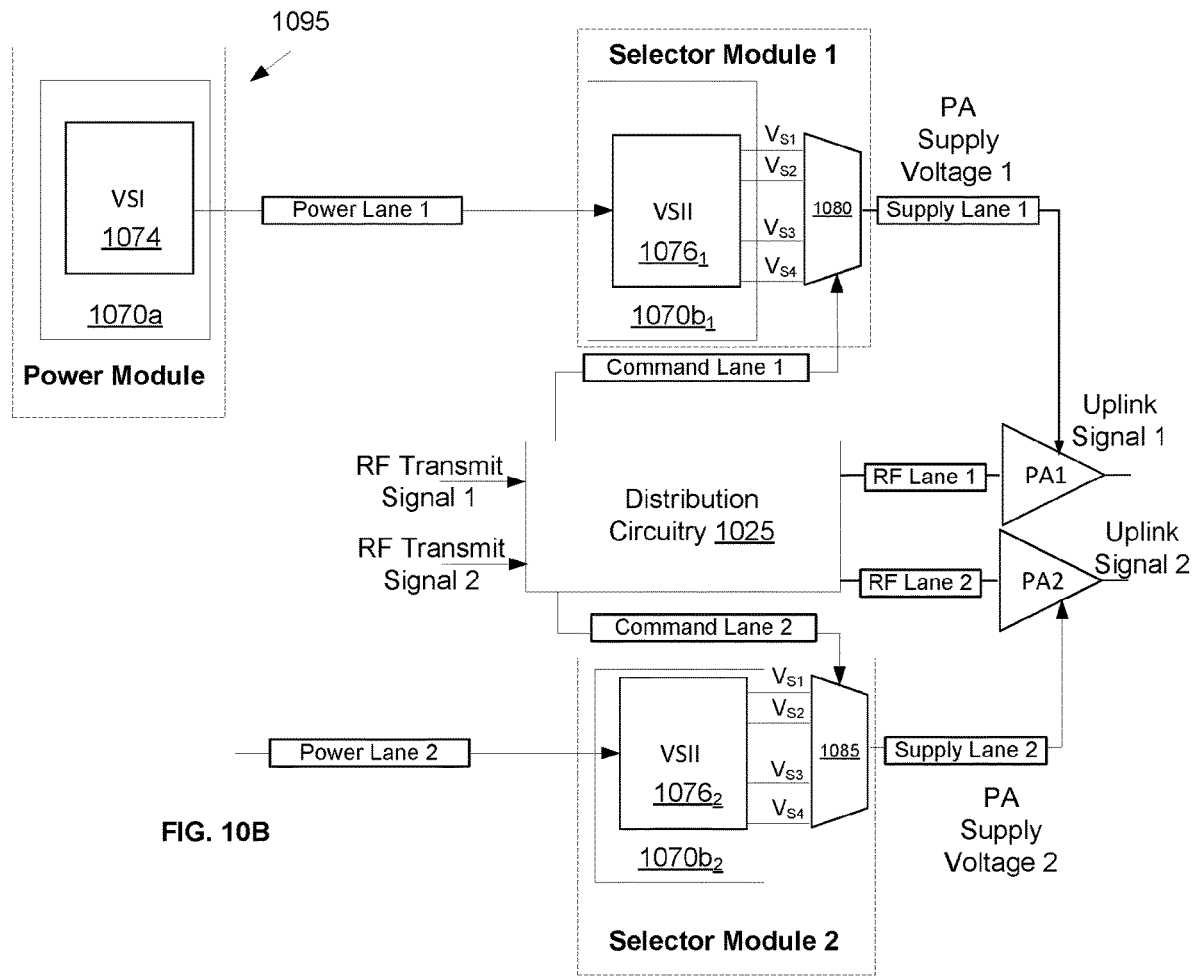

FIGS. 10A and 10B illustrate an example architectures in which the voltage source circuitry 1070 is split into two portions 1074 and 1076. In one example, the first portion 1074 is a voltage regulator such as a SIMO DCDC converter (described above). In one example, the second portion 1076 is a voltage splitter such as a charge pump (described above in FIGS. 9-9D) that uses a capacitor bank to better maintain the voltage levels. In FIG. 10A, both portions of the voltage source circuitry are located in the power module and the selector circuitry 1080 is located in the selector module. In FIG. 10B, the first portion of the voltage source circuitry 1074 is located in the power module while a "first" second portion 10761 is disposed in the first selector module and a "second" second portion 10762 is disposed in the second selector module.

Figure 11:
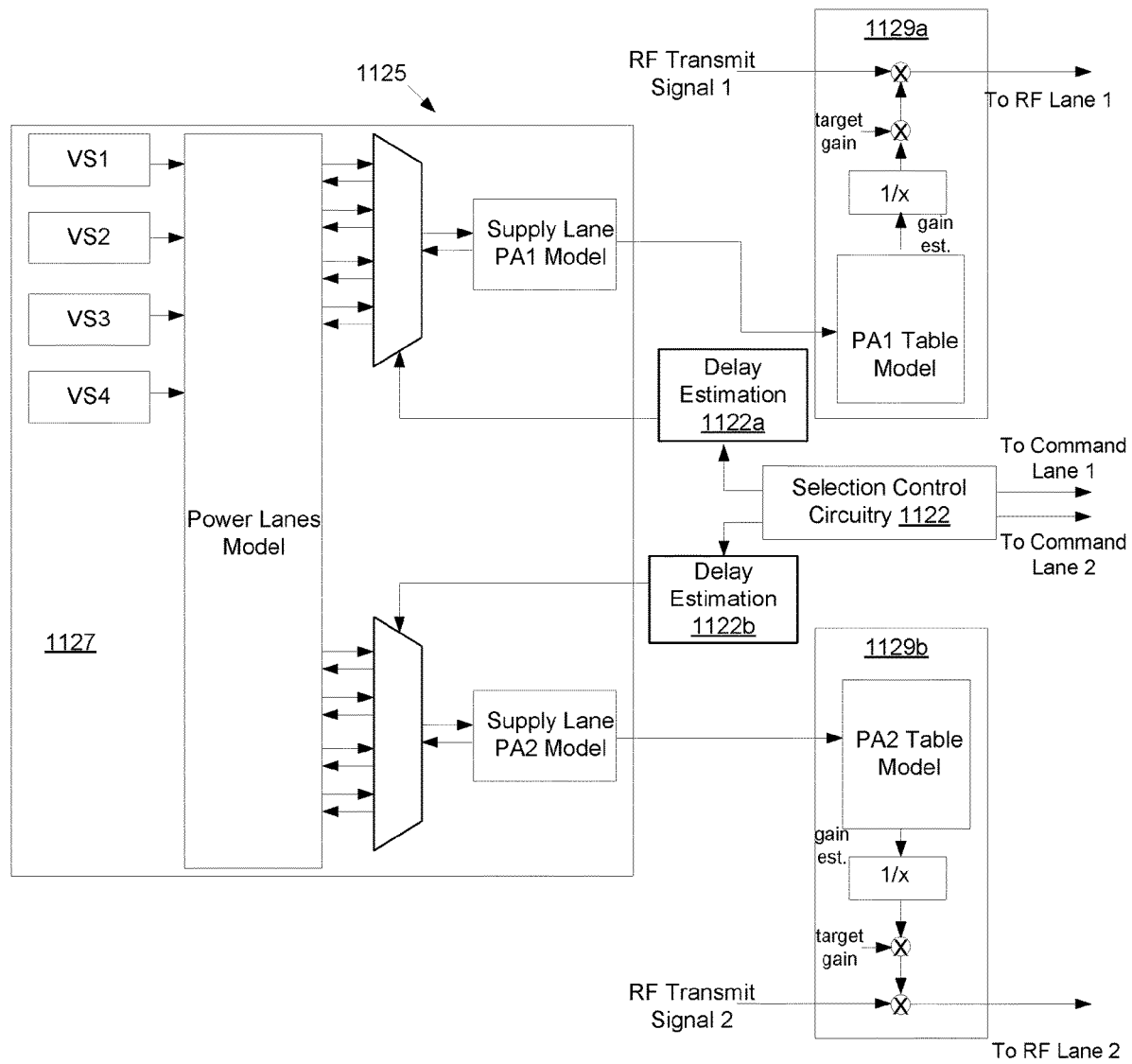
FIG. 11 illustrates an exemplary transmit path that predistorts an RF signal to compensate for the distributed feed forward DAC circuitry of FIG. 10.

FIG. 11 illustrates an example of distribution circuitry 1125 which may be implemented in an RF transceiver. The distribution circuitry includes predistortion circuitry 1129a for PA1 and predistortion circuitry 1129b for PA2, selection control circuitry 1122, and a model 1127 that predicts the effects of the wiring network (i.e., the power lanes and supply lanes). The model 1127 is a numeric model calibrated during a training phase in which known currents (e.g., currents expected to be induced by each different supply voltage) are conducted through the wiring network to the power amplifier and the selector circuitries are actuated to select different lanes. During the training phase, differential equations are determined that describe the transients and deviations experienced in the supply voltage to the power amplifier in response to switching between supply voltages (i.e., selector circuitry 1080, 1085 of FIG. 10 selecting a different voltage). The model is thus a discrete time model of the power distribution network (e.g., power and supply lanes) equations that is stimulated by the action of the selector circuitry switches.

The model includes a power lanes model and also a supply lane models for each PA. The power lanes model includes stored difference equations describing the wires from centralized voltage source circuitry (see 1070 of FIG. 10) to the distributed selector circuitries (see 1080, 1085 of FIG. 10). The supply lane models include stored difference equations describing the supply lane for each power amplifier. In one example, the order of the model is chosen based on the length of the lanes being modeled. For example, for a design with 3 cm power lanes, a third order power lanes model may be employed. The difference equations also model the behavior of the switches (e.g., selector circuitries) in the network. Thus, the difference equations describe a multi-port network which is stimulated by a model of the switches.

After the difference equations have been stored in the model 1127 during the training phase, when a new supply voltage is called for, selection control circuitry 1122 sends a command on the command lane to selector circuitry (e.g., either 1080 or 1085 of FIG. 10) to select the new supply voltage. The selection control circuitry also provides a selection input to a multiplexor that selects a model of the power lane associated with the new supply voltage. A delay estimation component 1122a is calibrated during the training phase to properly align the predistortion of the RF transmit signal with the transition in supply voltage. The model 1127 selects the new supply voltage (e.g., VS1, VS2, VS3, or VS4) and inputs a simulated supply voltage to a difference equation that includes the selected power lane model combined with the supply lane model as well as the transient introduced by the selector circuitry (e.g., either 1080 or 1085 of FIG. 10). The output of the model 1127 is a time varying current that represents the current that will be experienced at the supply port of the power amplifier during the transition between supply voltages.

Each predistortion circuitry 1129a, 1129b includes a table model that maps current (output by the model) to a modification (e.g., change in amplitude and/or phase) of the RF transmit signal that should be performed to compensate for the power amplifier's behavior in response to the changing supply voltage. The modification is normalized (e.g., subjected to division by an expected gain "x" and then multiplied by the expected gain x) prior to being combined with the RF transmit signal. The predistorted RF transmit signal is output on an RF lane to the power amplifier. In this manner, the RF transmit signal is predistorted based on the effects of the power lanes, the selector circuitry, and the supply lane, resulting in improved envelope tracking.

Figure 12:
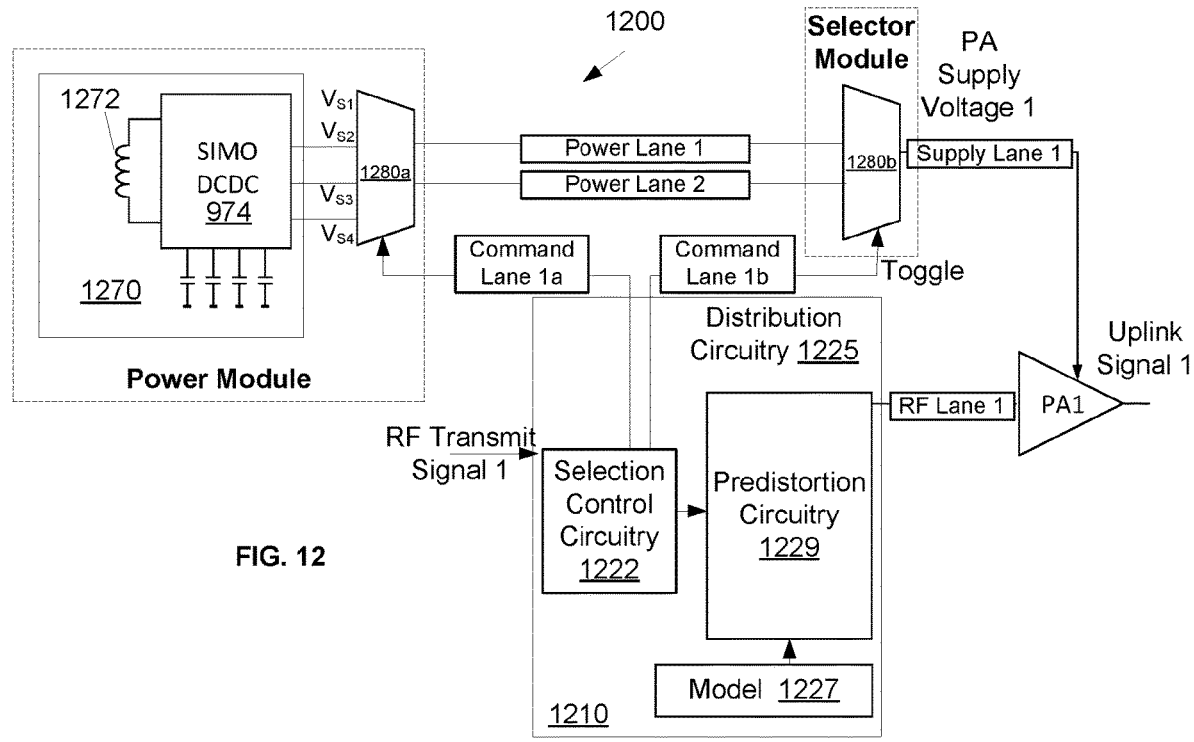
FIG. 12 illustrates an exemplary transmitter architecture that includes an alternative distributed feed forward DAC circuitry that supplies voltage to a power amplifier.

FIG. 12 illustrates an example of an architecture 1200 in which two power lanes are used instead of one power lane for each supply voltage as shown in FIGS. 10 and 11. In this example, distribution circuitry 1225 operates in a similar manner to the distribution circuitry 1125 of FIG. 11 with the following exceptions. The model 1227 is similar to the model of FIGS. 10 and 11 but has been calibrated with two power lanes and includes inputs for both a preselector switch/multiplexor 1280a disposed in or proximate the power module and a selector switch/multiplexor 1280b disposed in a selector module. Predistortion circuitry 1229 predistorts the RF transmit signal based on the output of the model 1227. Selection control circuitry 1222 is configured to control the preselector multiplexor 1280a to connect the presently selected supply voltage to one of the power lanes and a next selected supply voltage to the other of the power lanes.

For example, if the first supply voltage is VS1, the selection control circuitry controls the preselector multiplexor to connect VS1 to power lane 1 and also controls the selector multiplexor 1280b to connect power lane 1 to supply lane 1. When the selection control circuitry 1222 determines that the next supply voltage will be VS4, the selection control circuitry 1222 controls the preselector multiplexor to connect VS4 to power lane 2. When the selection control circuitry 1222 determines that it is time to change the supply voltage to the power amplifier to VS4, the selection control circuitry 1222 controls the selector multiplexor to connect power lane 2 to supply lane 1. The selection control circuitry 1222 then controls the preselector multiplexor to connect the next supply voltage to power lane 1, and so on. In essence, the selection control circuitry 1222 simply toggles the selector multiplexor between either power lane, simplifying the design of the second multiplexor.

Figure 13:
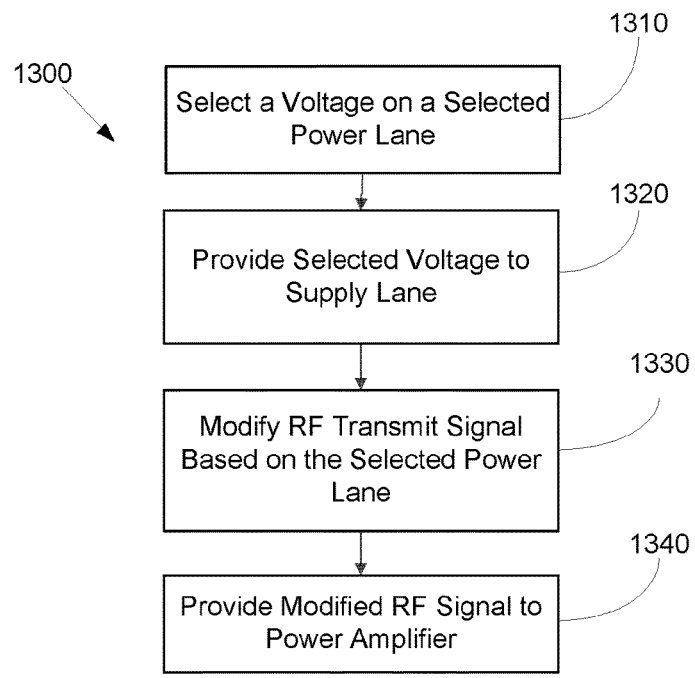
FIG. 13 illustrates an exemplary method for generating a supply voltage for a power amplifier using a distributed feed forward DAC.

FIG. 13 illustrates a flow diagram of an example method to generate a power amplifier supply voltage 1300. At 1310, the method includes selecting a voltage from a plurality of voltages. The selected voltage is conducted by a selected power lane of a first plurality of power lanes in a power distribution network based on the target envelope signal. This function may be performed, for example, by voltage source circuitry 1070 of FIG. 10. At 1320, the selected voltage is provided to a supply lane in the power distribution network that is connected to an input of a power amplifier that amplifies the RF transmit signal. This function may be performed, for example, by selector circuitry 1080 of FIG. 10. At 1330, the method includes modifying the RF transmit signal based on the selected power lane of the plurality of power lanes that conducts the selected voltage. This function may be performed, for example, by predistortion circuitry 1029, 1129a, 1129b, and/or 1229 of FIGS. 10, 11, and 12, respectively. The method includes, at 1340, providing the modified RF transmit signal to the power amplifier.

Figure 14:
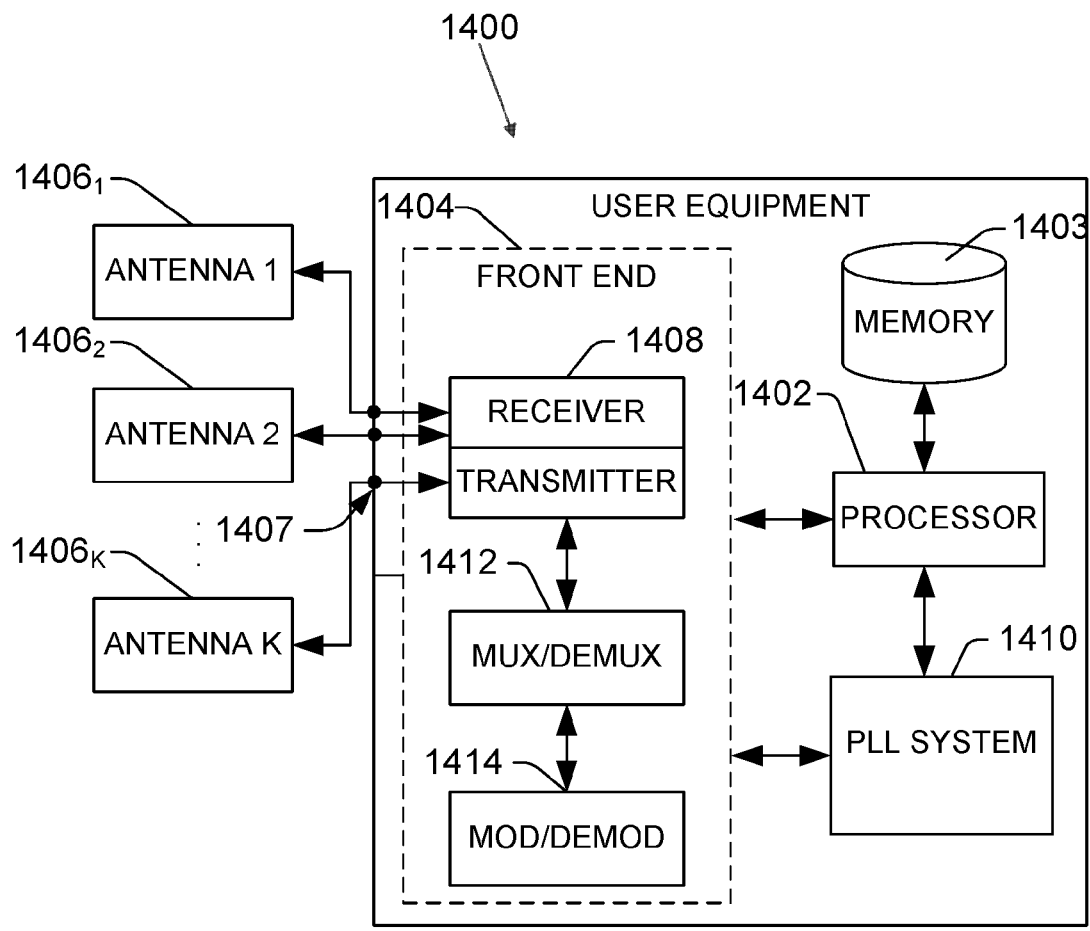
FIG. 14 illustrates an example user equipment device that includes a transmitter front end that includes frequency dependent envelope tracking circuitry in accordance with various aspects described.

To provide further context for various aspects of the disclosed subject matter, FIG. 14 illustrates a block diagram of an embodiment of user equipment 1400 (e.g., a mobile device, communication device, personal digital assistant, etc.) related to access of a network (e.g., base station, wireless access point, femtocell access point, and so forth) that can enable and/or exploit features or aspects of the disclosed aspects.

The user equipment or mobile communication device 1400 can be utilized with one or more aspects of the feed forward DAC circuitry described herein according to various aspects. The user equipment device 1400, for example, comprises a digital baseband processor 1402 that can be coupled to a data store or memory 1403, a front end 1404 (e.g., an RF front end, an acoustic front end, or the other like front end) and a plurality of antenna ports 1407 for connecting to a plurality of antennas 1406_1 to 1406_k (k being a positive integer). The antennas 1406_1 to 1406_k can receive and transmit signals to and from one or more wireless devices such as access points, access terminals, wireless ports, routers and so forth, which can operate within a radio access network or other communication network generated via a network device (not shown).

The user equipment 1400 can be a radio frequency (RF) device for communicating RF signals, an acoustic device for communicating acoustic signals, or any other signal communication device, such as a computer, a personal digital assistant, a mobile phone or smart phone, a tablet PC, a modem, a notebook, a router, a switch, a repeater, a PC, network device, base station or a like device that can operate to communicate with a network or other device according to one or more different communication protocols or standards.

The front end 1404 can include a communication platform, which comprises electronic components and associated circuitry that provide for processing, manipulation or shaping of the received or transmitted signals via one or more receivers or transmitters (e.g. transceivers) 1408, a mux/demux component 1412, and a mod/demod component 1414. The front end 1404 is coupled to the digital baseband processor 1402 and the set of antenna ports 1407, in which the set of antennas 1406₁ to 1406k can be part of the front end. In one aspect, the user equipment device 1400 can comprise a phase locked loop system 1410.

The processor 1402 can confer functionality, at least in part, to substantially any electronic component within the mobile communication device 1400, in accordance with aspects of the disclosure. As an example, the processor 1402 can be configured to execute, at least in part, executable instructions that determine transmitter operation parameters and select the different supply voltages to be generated as described in FIGS. 1-13. The processor 1400 may embody various aspects of the feed forward DAC circuitry, and so on, of FIGS. 1-13 as a multi-mode operation chipset that affords a feed forward approach to generating PA supply voltages.

The processor 1402 is functionally and/or communicatively coupled (e.g., through a memory bus) to memory 1403 in order to store or retrieve information necessary (e.g., stored power and supply lane models resulting from training) to operate and confer functionality, at least in part, to communication platform or front end 1404, the phase locked loop system 1410 and substantially any other operational aspects of the phase locked loop system 1410. The phase locked loop system 1410 includes at least one oscillator (e.g., a VCO, DCO or the like) that can be calibrated via core voltage, a coarse tuning value, signal, word or selection process according the various aspects described herein.

The processor 1402 can operate to enable the mobile communication device 1400 to process data (e.g., symbols, bits, or chips) for multiplexing/demultiplexing with the mux/demux component 1412, or modulation/demodulation via the mod/demod component 1414, such as implementing direct and inverse fast Fourier transforms, selection of modulation rates, selection of data packet formats, inter-packet times, etc. Memory 1403 can store data structures (e.g., metadata), code structure(s) (e.g., modules, objects, classes, procedures, or the like) or instructions, network or device information such as policies and specifications, attachment protocols, code sequences for scrambling, spreading and pilot (e.g., reference signal(s)) transmission, frequency offsets, cell IDs, and other data for detecting and identifying various characteristics related to RF input signals, a power output or other signal components during power generation.

While the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention.

Examples can include subject matter such as a method, means for performing acts or blocks of the method, at least one machine-readable medium including instructions that, when performed by a machine cause the machine to perform acts of the method or of an apparatus or system for concurrent communication using multiple communication technologies according to embodiments and examples described herein.

Example 1 is an envelope tracking system for generating a power amplifier supply voltage based on a target envelope signal for a radio frequency (RF) transmit signal that includes first selector circuitry and predistortion circuitry. The first selector circuitry is disposed in a selector module and is configured to input a plurality of voltages conducted on a first plurality of power lanes, wherein the first plurality of power lanes is part of a power distribution network; select a voltage from the plurality of voltages based on the target envelope signal; and provide the selected voltage to a supply lane connected to an input of the power amplifier that amplifies the RF transmit signal. The predistortion circuitry is configured to modify the RF transmit signal based on a selected power lane of the first plurality of power lanes that conducts the selected voltage.

Example 2 includes the subject matter of claim 1, including or omitting any optional elements, wherein the predistortion circuitry is configured to estimate deviations in the selected voltage due to the supply lane and the selected power lane and modify the RF transmit signal based on the estimated deviations.

Example 3 includes the subject matter of example 1, including or omitting optional elements, wherein the predistortion circuitry is configured to access a numeric model of the power distribution network that estimates voltage deviations in the selected voltage as a function of time for each power lane and the supply lane.

Example 4 includes the subject matter of claim 1, including or omitting any optional elements, wherein the first selector circuitry includes a switch that is configured to connect the selected power lane to the supply lane, and wherein the predistortion circuitry is configured to estimate transient behavior of the switch to determine the estimated deviations in the selected voltage due to the supply lane.

Example 5 includes the subject matter of examples 1-4, including or omitting optional elements, wherein the selector module is disposed in a front end module of a device.

Example 6 includes the subject matter of claims 1-4, including or omitting any optional elements, wherein there are fewer power lanes than voltages in the plurality of voltages, wherein the system further includes preselector circuitry and selection control circuitry. The preselector circuitry is configured to input the plurality of voltages and output a selected one of the plurality of voltages to each of the power lanes. The selection control circuitry is configured to control the preselector circuitry to connect the selected voltage to a first power lane, control the preselector circuitry to connect a next selected voltage to a second power lane; and control the first selector circuitry to select the first power lane and then the second power lane to provide the selected voltage, and then the next selected voltage to the power amplifier.

Example 7 includes the subject matter of claims 1-4, including or omitting any optional elements, further including the plurality of power lanes, each power lane including one or more of a coaxial cable, a flex-cable, a transmission line on a printed circuitry board, or a wire connection.

Example 8 includes the subject matter of claims 1-4, including or omitting any optional elements, further including voltage source circuitry configured to generate the plurality of voltages. The voltage source includes a first portion disposed in a power module, wherein the first portion is connected to a first end of the power lanes and a second portion disposed in the selector module, wherein the second portion is connected to a second end of the power lanes, such that an output of the second portion is connected to the input of the first selector circuitry.

Example 9 includes the subject matter of example 8, including or omitting optional elements, wherein the first portion is a voltage regulator.

Example 10 includes the subject matter of example 8, including or omitting optional elements, wherein the second portion is a voltage splitter.

Example 11 includes the subject matter of example 8, including or omitting optional elements, wherein the second portion is a voltage regulator.

Example 12 includes the subject matter of claims 1-4, including or omitting any optional elements, further including a second selector circuitry disposed in a second selector module. The second selector module is configured to input the plurality of voltages conducted on a second plurality of power lanes, wherein the second plurality of power lanes is part of the power distribution network; select a second voltage from the plurality of voltages based on a second target envelope signal associated with a second RF transmit signal; provide the selected second voltage to a second supply lane connected to an input of a second power amplifier that amplifies the second RF transmit signal. The predistortion circuitry is configured to modify the second RF transmit signal based on a selected second power lane of the second plurality of power lanes that conducts the selected second voltage.

Example 13 includes the subject matter of claim 12, including or omitting any optional elements, further including voltage source circuitry. The voltage source circuitry includes a first portion disposed in a power module, wherein the first portion is connected to a first end of the first plurality of power lanes and a first end of the second plurality of power lanes; a second portion disposed in the first selector module, wherein the second portion is connected to a second end of the first plurality of power lanes, such that an output of the second portion is connected to the input of the first selector circuitry; and a third portion disposed in the second selector module, wherein the third portion is connected to a second end of the second plurality of power lanes, such that an output of the third portion is connected to the input of the second selector circuitry.

Example 14 includes the subject matter of example 13, including or omitting optional elements, wherein: the first portion is a voltage regulator; the second portion is a voltage splitter; and the third portion is a voltage splitter.

Example 15 is a method to generate a power amplifier supply voltage based on a target envelope signal for a radio frequency (RF) transmit signal. The method includes selecting a voltage from a plurality of voltages, wherein the selected voltage is conducted by a selected power lane of a first plurality of power lanes in a power distribution network based on the target envelope signal, provide the selected voltage to a supply lane in the power distribution network that is connected to an input of a power amplifier that amplifies the RF transmit signal; modifying the RF transmit signal based on the selected power lane of the plurality of power lanes that conducts the selected voltage; and providing the modified RF transmit signal to the power amplifier.

Example 16 includes the subject matter of claim 15, including or omitting any optional elements, further including estimating deviations in the selected voltage due to the supply lane and the selected power lane and modifying the RF transmit signal based on expected deviations in the selected voltage due to the selected power lane.

Example 17 includes the subject matter of example 16, including or omitting optional elements, including modifying the RF transmit signal based on a numeric model of the power distribution network that estimates voltage deviations in the selected voltage as a function of time for each power lane and the supply lane.

Example 18 includes the subject matter of example 17, including or omitting optional elements, wherein the numeric model estimates the voltage deviations in the selected voltage based on an expected transient behavior of a switch that selects the voltage from the plurality of voltages.

Example 19 includes the subject matter of examples 15-18, including or omitting optional elements, wherein each power lane is longer than the supply lane.

Example 20 includes the subject matter of claims 15-19, including or omitting any optional elements, wherein there are fewer power lanes than voltages in the plurality of voltages, the method further including inputting the plurality of voltages; output the selected voltage to a first power lane; output a next selected voltage to second power lane; connect the first power lane to the supply lane to provide the selected voltage to the power amplifier; and then connect the second power lane to the supply lane to provide the next selected voltage to the power amplifier.

Example 21 includes the subject matter of claims 15-19, including or omitting any optional elements, further including selecting a second voltage from the plurality of voltages, wherein the second selected voltage is conducted by a second supply lane to an input of a second power amplifier that amplifies a second radio frequency (RF) transmit signal and modifying the second RF transmit signal based a second selected power lane of a second plurality of power lanes that conducts the second selected voltage.

Example 22 is an apparatus, including a power module and a selector module. The power module includes a voltage source circuitry configured to generate a plurality of voltages and provide the plurality of voltages to a corresponding first plurality of power lanes. The selector module, includes a first selector circuitry configured to receive the plurality of voltages from the first plurality of power lines, select a voltage from the plurality of voltages based on a target envelope signal; and provide the selected voltage to a supply lane connecting an output of the first selector circuitry to an input of a power amplifier that amplifies the RF transmit signal.

Example 23 includes the subject matter of example 22, including or omitting optional elements, further including: selection control circuitry configured to generate a command that controls the first selector circuitry to select the voltage based on a target envelope signal; and predistortion circuitry configured to modify the RF transmit signal based on a selected power lane of the first plurality of power lanes that conducts the selected voltage.

Example 24 includes the subject matter of example 23, including or omitting optional elements, wherein the predistortion circuitry is configured to modify the RF transmit signal based on expected deviations in the selected voltage due to the supply lane and the selected power lane.

Example 25 includes the subject matter of examples 22-24, including or omitting optional elements, wherein the voltage source circuitry includes a first portion disposed in the power module, wherein the first portion is connected to a first end of the power lanes and a second portion disposed in the selector module, wherein the second portion is connected to a second end of the power lanes, such that an output of the second portion is connected to the input of the first selector circuitry.

Various illustrative logics, logical blocks, modules, and circuits described in connection with aspects disclosed herein can be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform functions described herein. A general-purpose processor can be a microprocessor, but, in the alternative, processor can be any conventional processor, controller, microcontroller, or state machine.

The above description of illustrated embodiments of the subject disclosure, including what is described in the Abstract, is not intended to be exhaustive or to limit the disclosed embodiments to the precise forms disclosed. While specific embodiments and examples are described herein for illustrative purposes, various modifications are possible that are considered within the scope of such embodiments and examples, as those skilled in the relevant art can recognize.

In this regard, while the disclosed subject matter has been described in connection with various embodiments and corresponding Figures, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

In particular regard to the various functions performed by the above described components (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the disclosure. In addition, while a particular feature may have been disclosed with respect to only one of several implementations, such feature may be combined with one or more other features of the other implementations as may be desired and advantageous for any given or particular application. The use of the phrase "one or more of A, B, or C" is intended to include all combinations of A, B, and C, for example A, A and B, A and B and C, B, and so on.

The invention claimed is:

1. An envelope tracking system for generating power amplifier supply voltages for a plurality of power amplifiers, comprising:
 an envelope circuitry configured to generate a target envelope signal for a power amplifier based on a baseband transmit signal for the power amplifier;
 a voltage source circuitry configured to generate a set of supply voltages; and
 a plurality of selector circuitries, wherein each selector circuitry is coupled to a different power amplifier and is configured to select a supply voltage among the set of supply voltages for a corresponding power amplifier based on a target envelope signal for the corresponding power amplifier,
 wherein the voltage source circuitry is configured to generate the set of supply voltages based on one or more transmitter operation parameters.

2. The envelop tracking system of claim 1, wherein the target envelope signal includes voltage domain information that identifies which of the set of supply voltages to select and time domain information that identifies a time during which to provide the selected supply voltage to the corresponding power amplifier.

3. The envelope tracking system of claim 1, wherein the transmitter operation parameters include at least one of a transmit power level or a mode of operation.

4. The envelope tracking system of claim 1, wherein each selector circuitry comprises a dual impedance circuitry configured to provide a high impedance path and a low impedance path to the corresponding power amplifier, wherein the high impedance path is connected when the selector circuitry is initially connected to the voltage source circuitry and the low impedance path is connected after a predetermined delay period.

5. The envelope tracking system of claim 1, wherein each selector circuitry is located near the corresponding power amplifier.

6. The envelope tracking system of claim 1, further comprising:
 a predistortion circuitry configured to modify a transmit signal to be amplified by at least one of the power amplifiers to compensate for voltage switching transients and/or voltage drops on a power distribution network that distributes the supply voltages to the power amplifiers.

7. The envelop tracking system of claim 6, wherein the predistortion circuitry is configured to estimate the voltage switching transients and voltage drops in the supply voltages based on a numeric model of the power distribution network.

8. The envelope tracking system of claim 1, wherein the voltage source circuitry is configured to generate the set of supply voltages using an inductor and a single-inductor-multiple-output (SIMO) DCDC converter.

9. The envelope tracking system of claim 8, wherein the voltage source circuitry includes a charge pump arranged in parallel with the SIMO DCDC converter.

10. The envelope tracking system of claim 1, wherein the voltage source circuitry includes a voltage regulator and a voltage splitter.

11. A method for providing supply voltages to a plurality of power amplifiers, comprising:
 generating a target envelope signal for a power amplifier based on a baseband transmit signal for the power amplifier;
 generating a set of supply voltages;
 selecting a supply voltage among the set of supply voltages for each power amplifier based on the target envelope signal for each power amplifier; and
 providing the selected supply voltages to the power amplifiers,
 wherein the set of supply voltages are generated based on one or more transmitter operation parameters.

12. The method of claim 11, wherein the target envelope signal includes voltage domain information that identifies which of the set of supply voltages to select and time domain information that identifies a time during which to provide the selected supply voltage to the corresponding power amplifier.

13. The method of claim 11, wherein the transmitter operation parameters include at least one of a transmit power level or a mode of operation.

14. The method of claim 11, wherein the supply voltage is selected among the set of supply voltages by a selector circuitry comprising a dual impedance circuitry configured to provide a high impedance path and a low impedance path to the power amplifiers, wherein the high impedance path is connected when the selector circuitry is initially connected to a voltage source and the low impedance path is connected after a predetermined delay period.

15. The method of claim 11, further comprising:
modifying a transmit signal to be amplified by at least one of the power amplifiers to compensate for voltage switching transients and/or voltage drops on a power distribution network that distributes the supply voltages to the power amplifiers.

16. The method of claim 15, wherein the voltage switching transients and voltage drops in the supply voltages are estimated based on a numeric model of the power distribution network.

* * * * *